United States Patent
Nakanishi

(10) Patent No.: US 10,374,395 B2
(45) Date of Patent: Aug. 6, 2019

(54) THREE-COLOR LIGHT SOURCE

(71) Applicant: Sumitomo Electric Industries, Ltd., Osaka-shi (JP)

(72) Inventor: Hiromi Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/906,095

(22) Filed: Feb. 27, 2018

(65) Prior Publication Data

US 2018/0191136 A1 Jul. 5, 2018

Related U.S. Application Data

(63) Continuation of application No. 15/315,518, filed as application No. PCT/JP2015/058737 on Mar. 23, 2015, now Pat. No. 9,941,667.

(30) Foreign Application Priority Data

Jul. 2, 2014 (JP) .................. 2014-136991

(51) Int. Cl.
*H01S 5/40* (2006.01)
*H01S 5/024* (2006.01)
(Continued)

(52) U.S. Cl.
CPC ........ *H01S 5/4012* (2013.01); *H01S 5/02248* (2013.01); *H01S 5/02292* (2013.01);
(Continued)

(58) Field of Classification Search
CPC ............... H01S 5/4012; H01S 5/02248; H01S 5/02292; H01S 5/02415; H01S 5/0683;
(Continued)

(56) References Cited

U.S. PATENT DOCUMENTS 6,154,259 A 11/2000 Hargis et al.
2010/0067559 A1* 3/2010 Inoue ................. H01S 5/042
372/50.121

(Continued)

FOREIGN PATENT DOCUMENTS

JP    S57-068098 A    4/1982
JP    H4-345158 A    12/1992
(Continued)

OTHER PUBLICATIONS

International Search Report in counterpart International Application No. PCT/JP2015/058737, dated Jun. 23, 2015. [Cited in Parent].

(Continued)

*Primary Examiner* — Armando Rodriguez
(74) *Attorney, Agent, or Firm* — Baker Botts L.L.P.; Michael A. Sartori

(57) ABSTRACT

A three-color light source 1 is a three-color light source that combines red, green, and blue laser light so as to output light. The three-color light source 1 includes a red LD 11, a green LD 12, a blue LD 13, a first collimator lens 61, a second collimator lens 62, a third collimator lens 63, a first wavelength filter 81, a second wavelength filter 82, a carrier 30 that is equipped with the LDs 11 to 13, the collimator lenses 61 to 63, and the wavelength filters 81 and 82, and a TEC 40 that is equipped with the carrier 30. The red LD 11 is formed of a GaAs-based material, and the green LD 12 and the blue LD 13 are formed of GaN-based materials.

14 Claims, 11 Drawing Sheets

(51) Int. Cl.
  *H01S 5/323* (2006.01)
  *H01S 5/10* (2006.01)
  *H01S 5/022* (2006.01)
  *H01S 5/0683* (2006.01)

(52) U.S. Cl.
  CPC ........ *H01S 5/02415* (2013.01); *H01S 5/0683* (2013.01); *H01S 5/1092* (2013.01); *H01S 5/32316* (2013.01); *H01S 5/32341* (2013.01); *H01S 5/4093* (2013.01); *H01S 5/32325* (2013.01)

(58) Field of Classification Search
  CPC .. H01S 5/1092; H01S 5/32316; H01S 5/4093; H01S 5/32325
  See application file for complete search history.

(56) References Cited

U.S. PATENT DOCUMENTS

| | | | |
|---|---|---|---|
| 2013/0070206 A1* | 3/2013 | Kazama | G02B 19/0057 353/31 |
| 2014/0240952 A1 | 8/2014 | Nakanishi et al. | |
| 2015/0338664 A1 | 11/2015 | Nakanishi et al. | |

FOREIGN PATENT DOCUMENTS

| | | | |
|---|---|---|---|
| JP | H5-303031 A | 11/1993 | |
| JP | H6-290476 A | 10/1994 | |
| JP | H8-179447 A | 7/1996 | |
| JP | H8-181370 A | 7/1996 | |
| JP | H9-049948 A | 2/1997 | |
| JP | H9-096787 A | 4/1997 | |
| JP | H10-149559 | 6/1998 | |
| JP | H11-142763 A | 5/1999 | |
| JP | H11-330627 A | 11/1999 | |
| JP | 2000-031575 A | 1/2000 | |
| JP | 2000-131583 A | 5/2000 | |
| JP | 2000-277843 A | 10/2000 | |
| JP | 2000-301764 A | 10/2000 | |
| JP | 2002-335032 A | 11/2002 | |
| JP | 2003-037328 A | 2/2003 | |
| JP | 2003-215406 A | 7/2003 | |
| JP | 2003-273440 A | 9/2003 | |
| JP | 2005-309370 A | 11/2005 | |
| JP | 2005-352037 A | 12/2005 | |
| JP | 2006-186243 A | 7/2006 | |
| JP | 2007-036046 A | 2/2007 | |
| JP | 2008-026462 A | 2/2008 | |
| JP | 2008-244384 A | 10/2008 | |
| JP | 2008-282987 A | 11/2008 | |
| JP | 2009-266463 A | 11/2009 | |
| JP | 2010-533880 A | 10/2010 | |
| JP | 2011-102901 A | 5/2011 | |
| JP | 2011-108939 A | 6/2011 | |
| JP | 2011-165715 A | 8/2011 | |
| JP | 4809507 B1 | 11/2011 | |
| JP | 2012-164924 A | 8/2012 | |
| JP | 2012-247529 A | 12/2012 | |
| JP | 2013-187406 A | 9/2013 | |
| JP | 2013-190594 A | 9/2013 | |
| JP | 5336600 B2 | 11/2013 | |
| JP | 2014-063063 A | 4/2014 | |
| JP | 2014-096424 A | 5/2014 | |
| JP | 2014-102498 A | 6/2014 | |
| JP | 2014-168021 A | 9/2014 | |
| WO | 2007/040089 A1 | 4/2007 | |
| WO | 2009/012846 A1 | 1/2009 | |
| WO | 2011/040290 A1 | 4/2011 | |
| WO | 2012/014798 A1 | 2/2012 | |
| WO | 2012/073330 A1 | 6/2012 | |
| WO | 2013/146313 A1 | 10/2013 | |
| WO | 2013/146749 A1 | 10/2013 | |

OTHER PUBLICATIONS

International Preliminary Report on Patentability and Written Opinion in counterpart International Application No. PCT/JP2015/058737, dated Jan. 12, 2017. [Cited in Parent].

Notice of Reasons for Rejection in counterpart Japanese Patent Application No. 2014-136991, dated Oct. 20, 2015. [Cited in Parent].

Decision of Dismissal of Amendment in counterpart Japanese Patent Application No. 2014-136991, dated Apr. 5, 2016. [Cited in Parent].

Notice of Reasons for Rejection in counterpart Japanese Patent Application No. 2014-136991, dated Aug. 30, 2016. [Cited in Parent].

Notice of Reasons for Rejection in counterpart Japanese Patent Application No. 2014-136991, dated Nov. 8, 2016. [Cited in Parent].

* cited by examiner

*Fig.1*
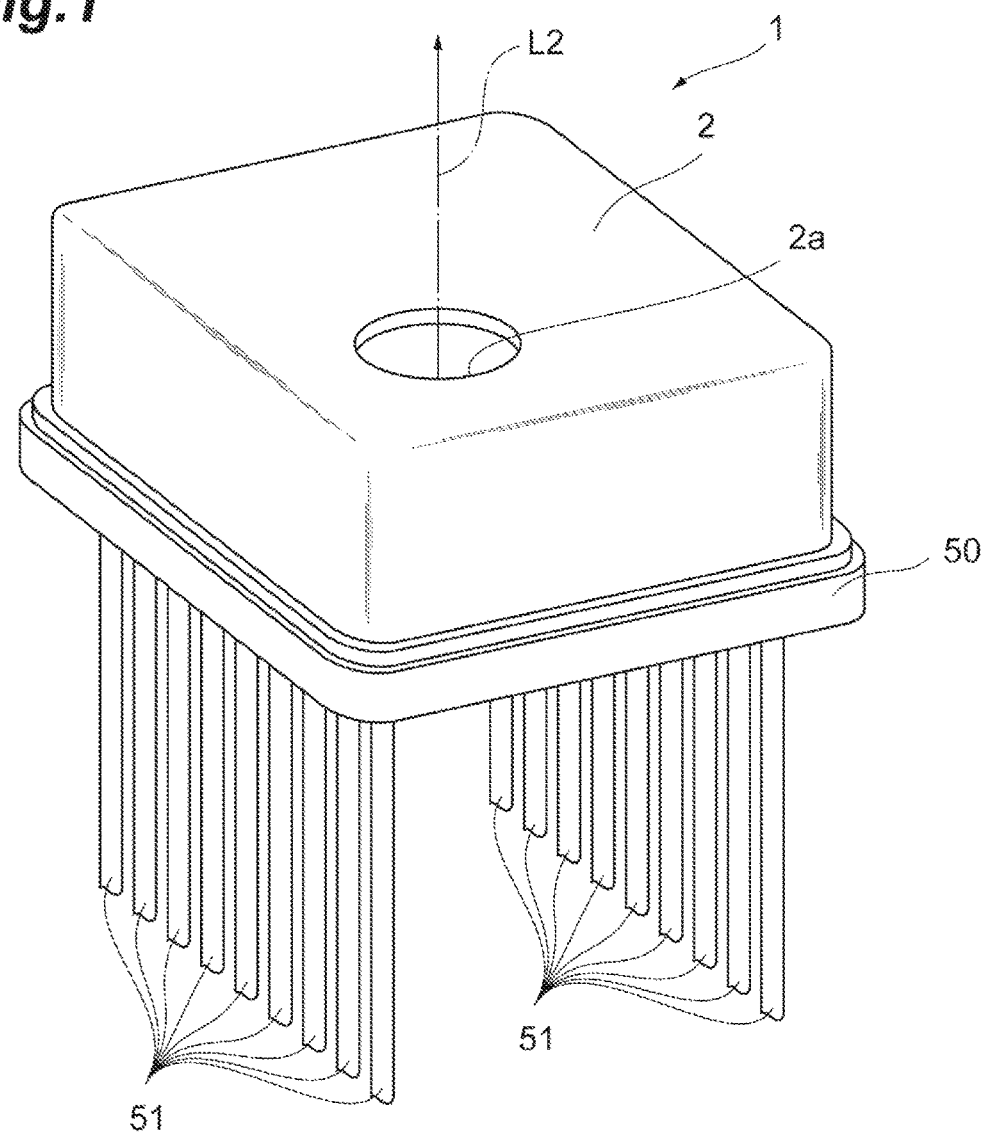
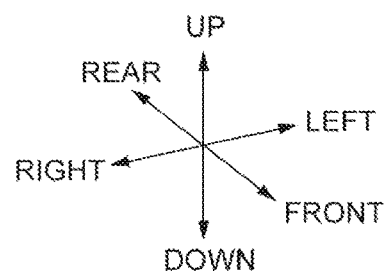

Fig.2
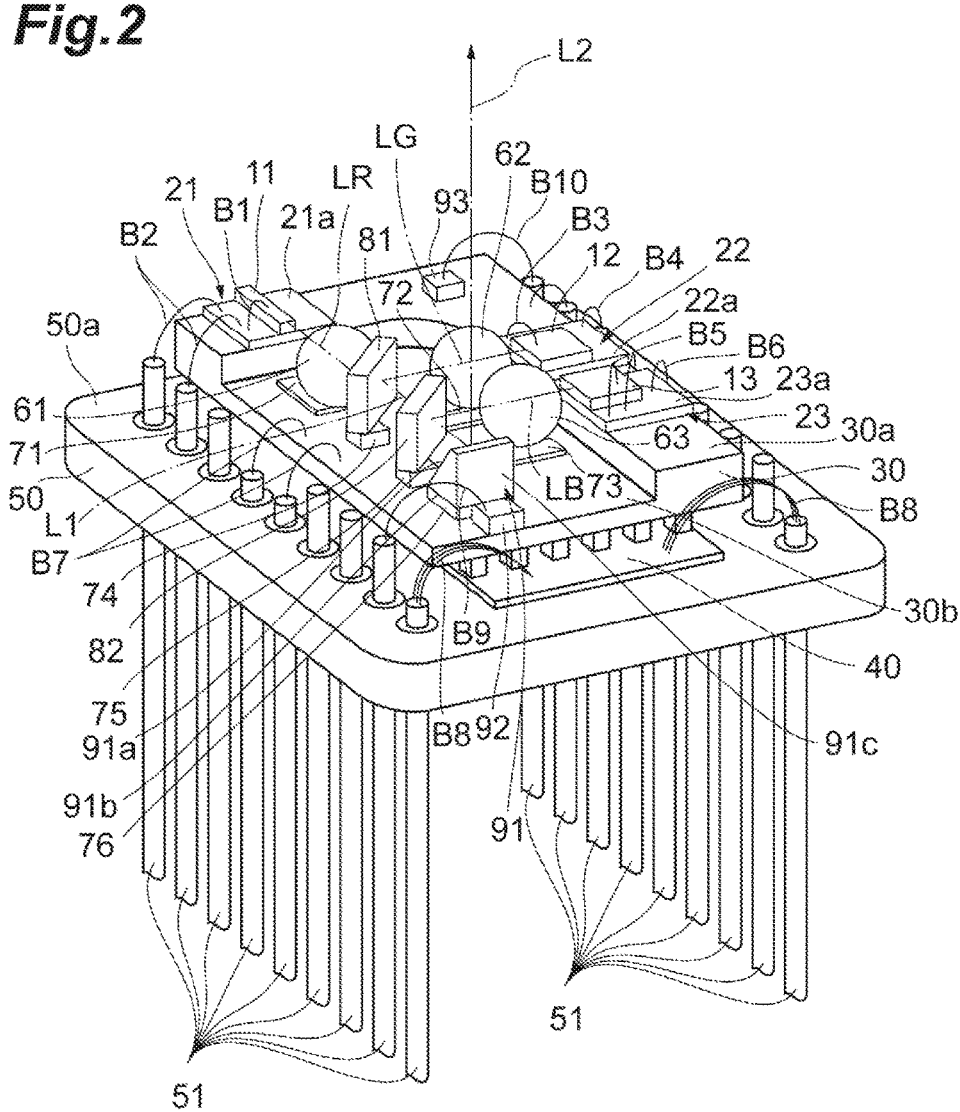
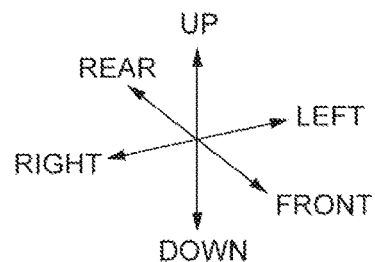

Fig.5
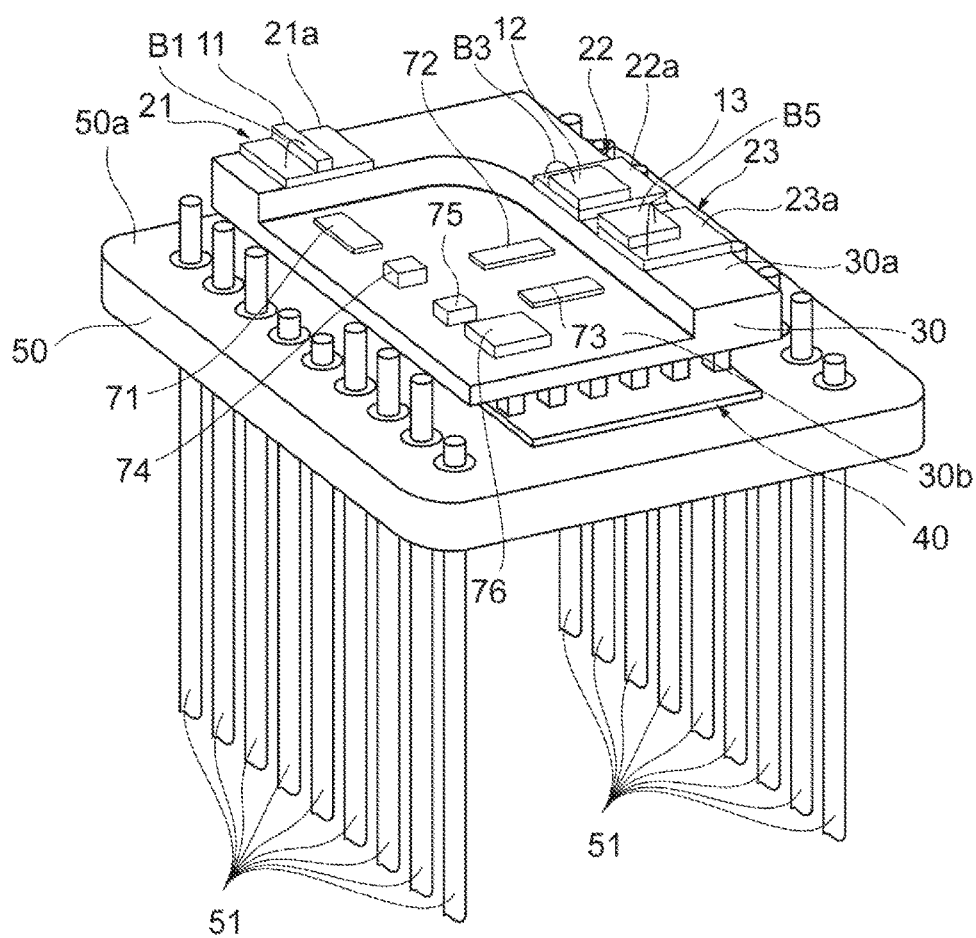
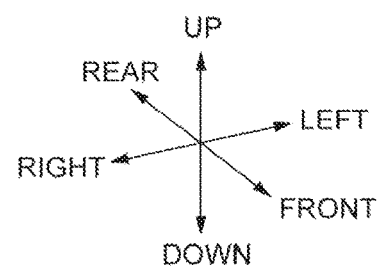

*Fig.6*
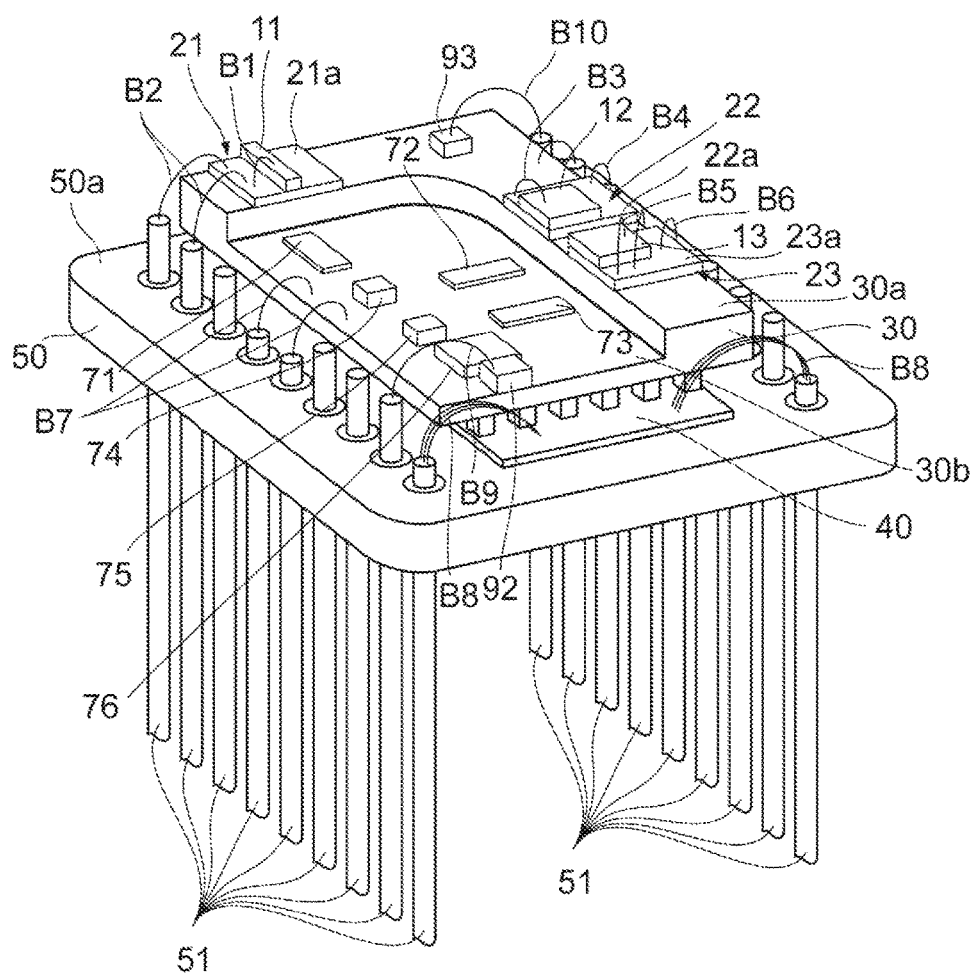
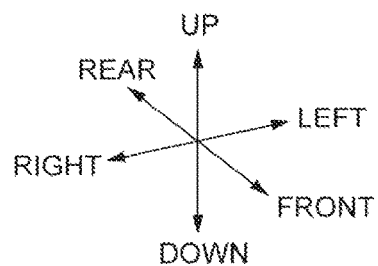

Fig.7
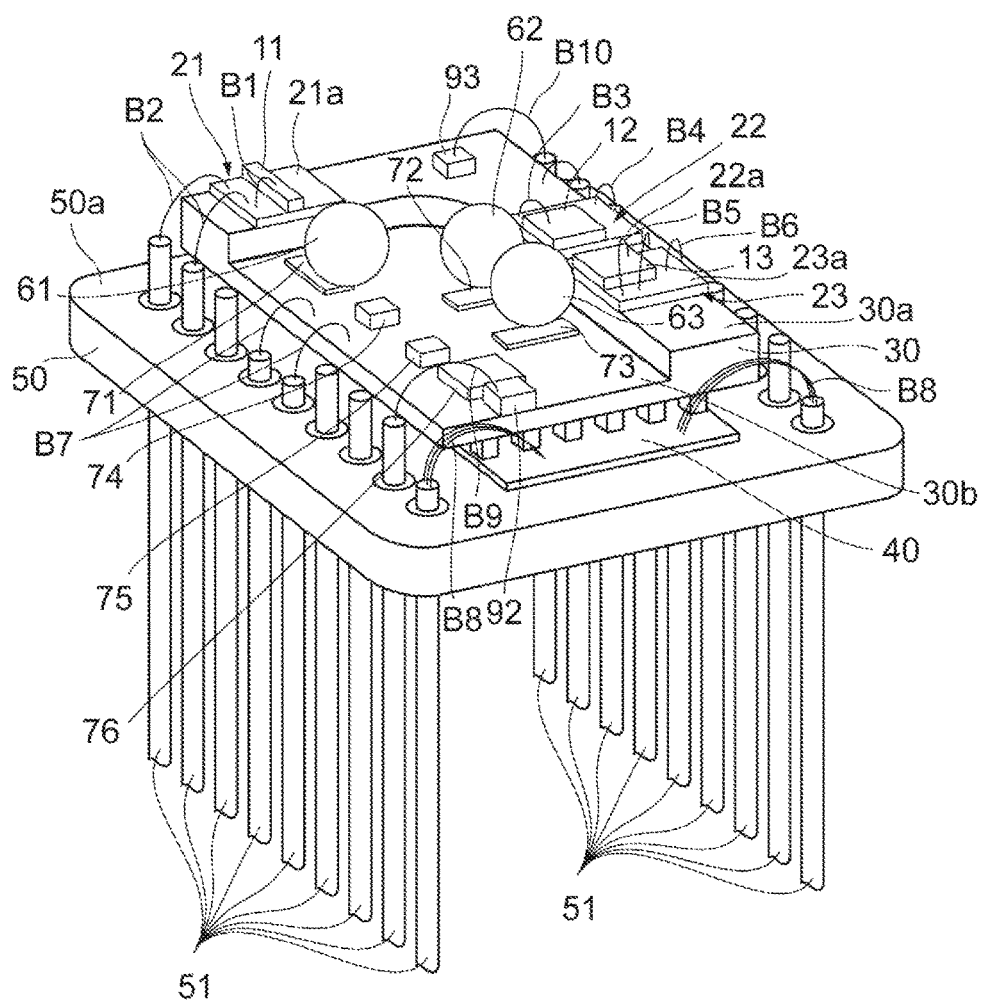
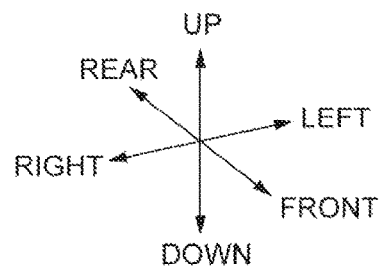

*Fig.8*
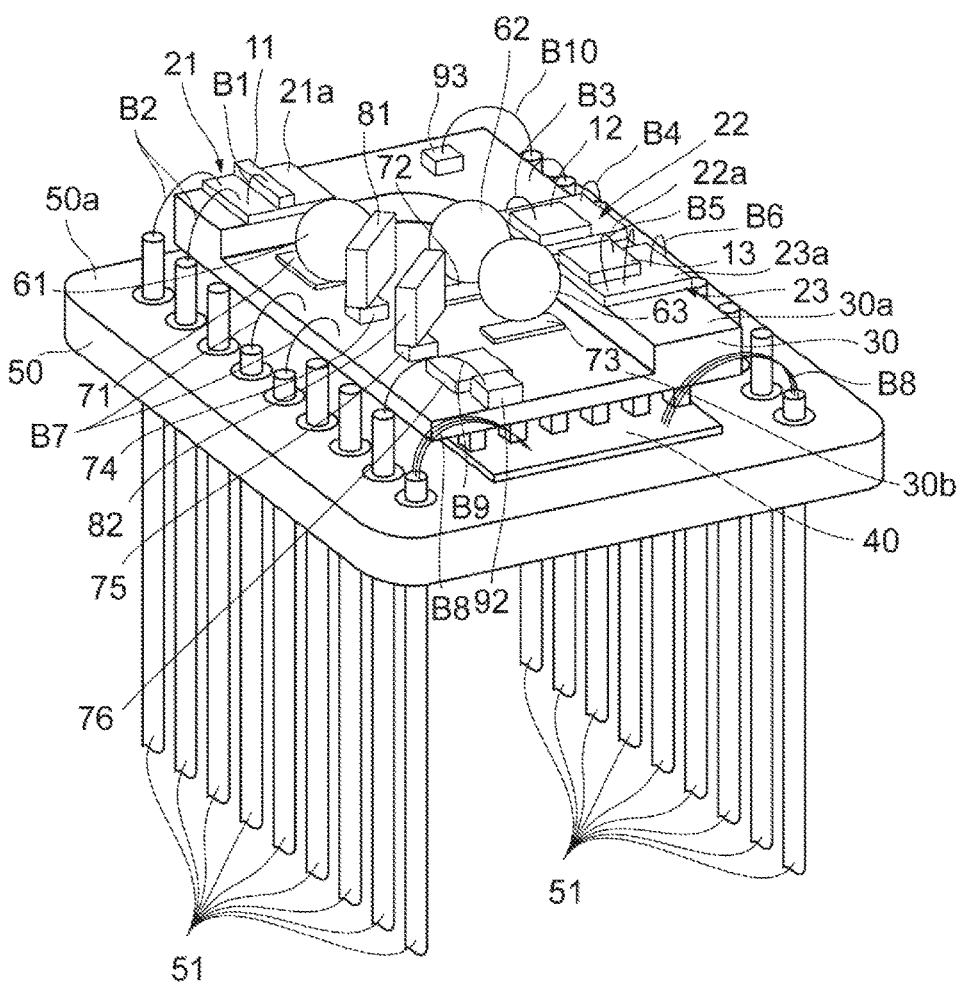
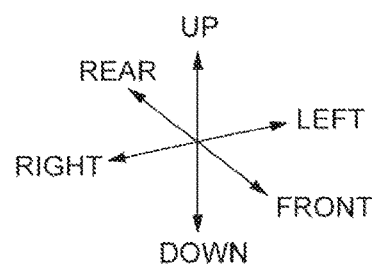

*Fig.9*

| BEAM WIDTH (σ) | X(μm) | Y(μm) |
|---|---|---|
| R | 1760 | 967 |
| G | 879 | 829 |
| B | 798 | 739 |

*Fig.11*
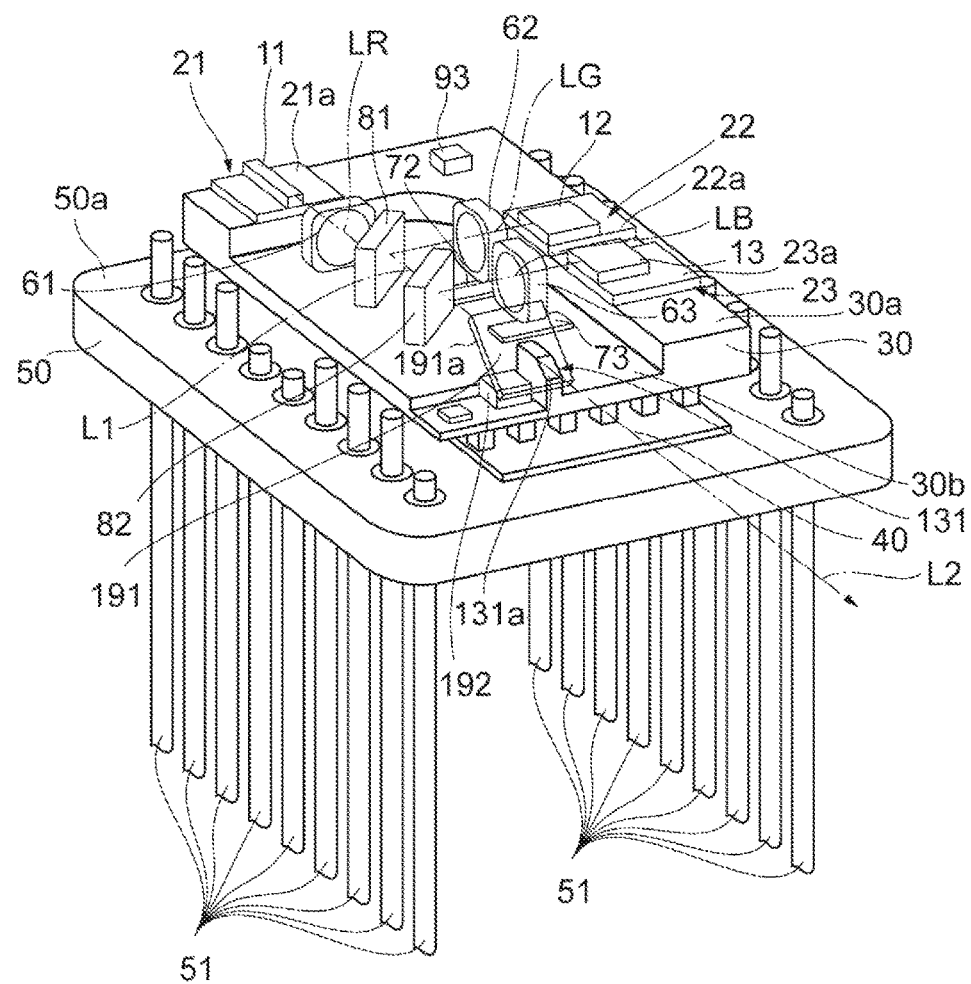
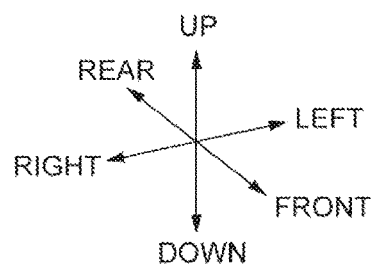

THREE-COLOR LIGHT SOURCE

CROSS-REFERENCE TO RELATED APPLICATIONS

This application is a Continuation application of U.S. patent application Ser. No. 15/315,518, filed on Dec. 1, 2016, which is a 371 of International Application No. PCT/JP2015/058737, filed Mar. 23, 2015, which claims priority to Japanese Patent Application No. 2014-136991, filed Jul. 2, 2014.

TECHNICAL FIELD

The present invention relates to a three-color light source used for display, illumination, communication, analysis, medical apparatuses, or the like.

BACKGROUND ART

Patent Literature 1 describes a laser projection apparatus as a projection display that projects an image onto a screen. This laser projection apparatus has a red laser light source, a blue laser light source, a green laser light source, and a heat dissipating unit. The heat dissipating unit dissipates heat within a casing of the laser projection apparatus to the outside by discharging cooling water into the casing. The cooling water, which is discharged from the heat dissipating unit, removes heat from the blue laser light source and the green laser light source after the red laser light source is cooled down, and returns back to the heat dissipating unit. As described above, since the cooling water removes heat from the red laser light source prior to the blue laser light source and the green laser light source, the temperature of the red laser light source is kept low.

Patent Literature 2 describes a multi-coaxial-laser light source apparatus. The multi-coaxial-laser light source apparatus includes: a collimator lens; a semiconductor laser array that has three light emitting points; pulse lighting control means for selectively performing pulse lighting at the light emitting points; and relative position control means for changing relative positions of the collimator lens and the semiconductor laser array. The relative position control means controls the relative positions of the collimator lens and the semiconductor laser array such that the optical axis of the collimator lens is positioned on the optical axis of each laser light which is emitted through the pulse lighting in accordance with the timing of pulse lighting. Each laser light is converted into parallel light through the collimator lens, and the optical axis of each laser light is substantially the same in a part in which passage areas of the laser light beams overlap.

Patent Literature 3 describes a planar illumination apparatus. The planar illumination apparatus includes: a laser light source that emits three-color laser light beams with different wavelengths; a fiber which has one end, from which three-color laser light beams are incident, and the other end from which the laser light is emitted as emitted light; and a transmission optical member that converts the emitted light into planar illumination light. The multiple laser light beams are incident to one end of the fiber at different NA values according to wavelengths different from each other.

CITATION LIST

Patent Literature

[Patent Literature 1] WO No. 2007/040089
[Patent Literature 2] Japanese Unexamined Patent Publication No. 2011-165715
[Patent Literature 3] Japanese Unexamined Patent Publication No. 2009-266463

SUMMARY OF INVENTION

Technical Problem

The above-mentioned three-color light source is equipped with laser diodes (LD), which respectively emit red, green, and blue laser light, so as to be formed as a white light source. In this case, it is necessary to consider chromatic dispersion shown in concentrated light. In particular, the LD, which emits red laser light, has a large temperature coefficient of a wavelength of the emitted light, and thus the wavelength thereof tends to be changed by changes in ambient environmental temperature. That is, the red laser light has a large temperature property as compared with the green laser light and the blue laser light. For example, in a case where the LD which emits the red laser light is formed of an AlGaInP-based material, when the environmental temperature is in a range of 20° C. to 70° C., a wavelength thereof changes by maximally 10 nm, and an optical output (light emitting efficiency) thereof changes by about 40%.

Further, the combined light of the light beams, which are converted into collimated light beams through the collimator lenses respectively corresponding to the emitted light beams of the respective LDs, may be concentrated through a scanning optical system (MEMS or the like). Accordingly, in a case where the light beams are not kept to be collimated through the collimator lenses, when the light beams are concentrated through the scanning optical system, color spreading such as astigmatism or spherical aberration is likely to occur. Furthermore, as described above, in particular, the red LD has a great effect of the temperature property, and tends to change even at a focus position of the lens or a refractive index of the lens in accordance with a temperature. Therefore, there is a problem in that the quality is unlikely to be maintained.

An object of the present invention is to provide a three-color light source which is unlikely to be affected by the environmental temperature and is able to maintain a collimation property.

Solution to Problem

According to an aspect of the present invention, there is provided a three-color light source that outputs light by combining red, green and blue laser light, the three-color light source including: a first laser diode that is formed of a GaAs-based material and emits first laser light; a second laser diode that is formed of a GaN-based material and emits second laser light; a third laser diode that is formed of a GaN-based material and emits third laser light with a wavelength which is different from that of the second light; a first collimator lens that collimates the first laser light; a second collimator lens that collimates the second laser light; a third collimator lens that collimates the third laser light; a first wavelength filter that transmits the first laser light which is collimated through the first collimator lens, reflects the second laser light which is collimated through the second collimator lens, and outputs first combined light in which the first laser light and the second laser light are combined; a second wavelength filter that performs a one of transmission and reflection on the first combined light, performs the another of transmission and reflection on the third laser light which is collimated through the third collimator lens, and outputs second combined light in which the first combined light and the third laser light are combined; a carrier that is equipped with the first to third laser diodes, the first to third collimator lenses, and the first and second wavelength filters; and a temperature control element that is equipped with the carrier.

Advantageous Effects of Invention

According to the present invention, it is possible to provide a three-color light source that is unlikely to be affected by the environmental temperature and is able to maintain the collimation property.

BRIEF DESCRIPTION OF DRAWINGS

FIG. 1 is a perspective view illustrating a three-color light source according to a first embodiment of the present invention.

FIG. 2 is a perspective view illustrating a state where a cap of the three-color light source shown in FIG. 1 is removed.

FIG. 5 is a perspective view illustrating a state where the carrier is mounted on the TEC.

FIG. 6 is a perspective view illustrating a state where lead pins and components on the base member are wired.

FIG. 7 is a perspective view illustrating a state where collimator lenses are mounted on the carrier of FIG. 6.

FIG. 8 is a perspective view illustrating a state where wavelength filters are mounted on the carrier of FIG. 6.

FIG. 9 is a table showing beam patterns of colors.

FIG. 11 is a perspective view illustrating a state where a cap of the three-color light source shown in FIG. 10 is removed.

DESCRIPTION OF EMBODIMENTS

Figure 3:
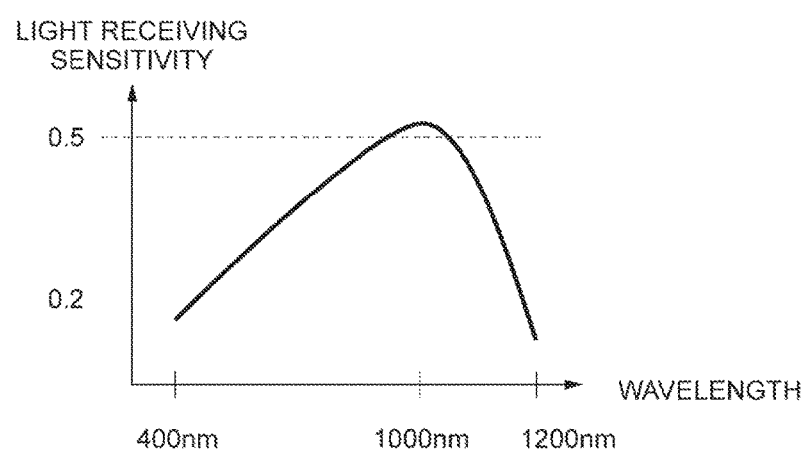
FIG. 3 is a graph illustrating a relationship between a wavelength of laser light and a light receiving sensitivity.

Hereinafter, referring to the accompanying drawings, embodiments of a three-color light source according to the present invention will be described in detail. It should be noted that, in description of the drawings, the same components are represented by the same reference signs and numerals, and redundant description will be omitted.

First Embodiment

FIG. 1 is a perspective view illustrating a three-color light source 1 according to a first embodiment of the present invention. FIG. 2 is a perspective view illustrating a state where a cap 2 is removed from the three-color light source 1. As shown in FIGS. 1 and 2, the three-color light source 1 generates first combined light L1 in which red laser light LR and green laser light LG are combined, and generates second combined light L2 in which the first combined light L1 and blue laser light LB are combined. The three-color light source 1 includes a red LD 11, a green LD 12, a blue LD 13, a first sub-mount 21, a second sub-mount 22, a third sub-mount 23, a carrier 30, a temperature control element (TEC) 40, a base member 50, a mirror 91, a photo diode (PD) 92, and a thermistor (temperature measurement resistor) 93.

The following drawings describe an "up-down direction", a "front-rear direction", and a "left-right direction", but these terms are for convenience of description based on situations of the drawings. In the following description, the up direction is a normal line direction (a direction of emission of the combined light L2) of the carrier 30, the front direction is a direction of emission of the red laser light LR from the red LD 11, and the right direction is a direction of emission of the green laser light LG emitted from the green LD 12 (a direction of emission of the blue laser light LB emitted from the blue LD 13).

The base member 50 has a planar principal surface 50a. 18 lead pins 51 are penetrated through the base member 50. Among the 18 lead pins 51, 9 lead pins 51 are arranged in the front-rear direction on the left side of TEC 40, the remaining 9 lead pins 51 are arranged in the front-rear direction on the right side of TEC 40. Each lead pin 51 protrudes on the principal surface 50a of the base member 50.

Further, among the 18 lead pins 51, 8 pins can be assigned for signals supplied to respective anodes and cathodes, each pair provided to each of the LDs 11 to 13 and PD 92, and 2 pins can be assigned for supplying current to the TEC 40. The other lead pins 51 can be assigned for GND line. In addition, instead of the base member 50, for example, it is also possible to use a general-purpose coaxial package with an outer diameter of 5.6 mm, a square ceramic package, or a bare substrate (hybrid IC substrate) such as AlN, SiC or sapphire.

The TEC 40 is mounted on the principal surface 50a of the base member 50. A wiring pad of the TEC 40 is electrically connected to the lead pins 51 through bonding wires B8. The carrier 30 is mounted on the TEC 40. A wiring pad of the carrier 30 is electrically connected to the lead pins 51 through bonding wires B7. The carrier 30 has a first principal surface 30a and a second principal surface 30b. The second principal surface 30b is formed by notching the top of the front and right side of the first principal surface 30a, and a height of the second principal surface 30b is lower than a height of the first principal surface 30a.

That is, the carrier 30 has the first principal surface 30a and the second principal surface 30b having heights different from each other, where a level difference is formed by such principal surfaces 30a and 30b. Further, a shape of the carrier 30 in a plan view is, for example, a square shape each side having a length of 10 mm. The first principal surface 30a in a plan view is formed in an L shape. The first principal surface 30a is formed as an LD mount region on which the red LD 11, the green LD 12, and the blue LD 13 are mounted. Further, first to third sub-mounts 21, 22, and 23 also respectively have planar principal surfaces 21a, 22a, and 23a.

The red LD 11 is a first laser diode in the present embodiment, and emits red laser light (first laser light) LR. The red LD 11 is a red semiconductor laser formed of, for example, a GaAs-based material. Here, the GaAs-based material indicates a semiconductor material which is lattice-matched to GaAs, and includes, for example, GaAs, AlGaInP, and the like. The red LD 11 is mounted on the principal surface 21a of the first sub-mount 21, and is mounted on the first principal surface 30a of the carrier 30 with the first sub-mount 21 interposed therebetween. The red LD 11 is electrically connected to the first sub-mount 21 through bonding wires B1, and the first sub-mount 21 is electrically connected to the lead pins 51 through bonding wires B2. The red LD 11 also emits the red laser light LR on the optical axis along the first principal surface 30a. A wavelength of the red laser light LR, which is emitted from the red LD 11, is, for example, 640 nm.

The green LD 12 is a second laser diode in the present embodiment, and emits green laser light (second laser light) LG. The green LD 12 is mounted on the principal surface 22a of the second sub-mount 22, and is mounted on the first principal surface 30a of the carrier 30 with the second sub-mount 22 interposed therebetween. The green LD 12 is electrically connected to the second sub-mount 22 through bonding wires B3, and the second sub-mount 22 is electrically connected to the lead pins 51 through bonding wires B4. The green LD 12 also emits the green laser light LG on the optical axis along the first principal surface 30a. In the present embodiment, a direction of emission of the green laser light LG emitted from the green LD 12 is set at a right angle to a direction of emission of the red laser light LR emitted from the red LD 11. A wavelength of the green laser light LG is, for example, 535 nm. The green LD 12 is formed of, for example, a GaN-based material. Typically, the material is GaN itself, and the material is not limited to this. Any material may be used if the material is able to output light with a wavelength of about 500 to 550 nm corresponding to green.

The blue LD 13 is a third laser diode in the present embodiment, and emits blue laser light (third laser light) LB. The blue LD 13 is mounted on the principal surface 23a of the third sub-mount 23, and is mounted on the first principal surface 30a of the carrier 30 with the third sub-mount 23 interposed therebetween. The blue LD 13 is electrically connected to the third sub-mount 23 through bonding wires B5, and the third sub-mount 23 is electrically connected to the lead pins 51 through bonding wires B6. The blue LD 13 also emits the blue laser light LB on the optical axis along the first principal surface 30a. In the present embodiment, a direction of emission of the blue laser light LB emitted from the blue LD 13 is set at a right angle to the direction of emission of the red laser light LR emitted from the red LD 11, and is set to be parallel with the direction of emission of the green laser light LG emitted from the green LD 12. A wavelength of the blue laser light LB is, for example, 440 nm. The blue LD 13 is formed of, for example, a GaN-based material. Typically, the material is GaN itself, and the material is not limited to this. Any material may be used if the material is able to output light with a wavelength of about 410 to 460 nm corresponding to blue.

In the present embodiment, in a case where the first principal surface 30a of the carrier 30 is set as a reference, heights of the sub-mounts 21 to 23 are set such that a height of a laser light emitting point of the red LD 11, a height of a laser light emitting point of the green LD 12, and a height of a laser light emitting point of the blue LD 13 are the same as each other. That is, the optical axis of the red laser light LR, the optical axis of the green laser light LG, and the optical axis of the blue laser light LB have substantially the same heights when the first principal surface 30a is set as a reference. It should be noted that a height of the light emission end face of each of the laser light LR, LG, and LB in the LDs 11 to 13 is substantially equal to a height of the top of each of the LDs 11 to 13.

As materials of the first to third sub-mounts 21 to 23, it is possible to use materials which have thermal expansion coefficients approximate to that of the semiconductor materials forming the red LD 11, the green LD 12, and the blue LD 13. For example, it is possible to use AlN, SiC, Si, diamond, or the like. Each of the red LD 11, the green LD 12, and the blue LD 13 is fixed onto each of the first to third sub-mounts 21 to 23 by a paste such as Au, Sn, SnAgCu, or Ag, or the like.

The three-color light source 1 further includes a first collimator lens 61, a second collimator lens 62, a third collimator lens 63, a first sub-base member 71, a second sub-base member 72, a third sub-base member 73, a first wavelength filter 81, a second wavelength filter 82, a fourth sub-base member 74, and a fifth sub-base member 75. Further, the second principal surface 30b of the carrier 30 is formed as a lens mount region in which the first collimator lens 61, the second collimator lens 62, and the third collimator lens 63 are mounted. Thicknesses of the first to fifth sub-base members 71 to 75 are, for example, about 0.1 mm.

The first collimator lens 61 is optically connected to a light emission end face of the red LD 11, and collimates the red laser light LR (make the light parallel) emitted from the red LD 11. The first collimator lens 61 is mounted on the first sub-base member 71, and is mounted on the second principal surface 30b of the carrier 30 with the first sub-base member 71 interposed therebetween.

The second collimator lens 62 is optically connected to a light emission end face of the green LD 12, and collimates the green laser light LG emitted from the green LD 12. The second collimator lens 62 is mounted on the second sub-base member 72, and is mounted on the second principal surface 30b of the carrier 30 with the second sub-base member 72 interposed therebetween.

The third collimator lens 63 is optically connected to a light emission end face of the blue LD 13, and collimates the blue laser light LB emitted from the blue LD 13. The third collimator lens 63 is mounted on the third sub-base member 73 which is disposed to be in line with the side (the front side) of the second sub-base member 72. The third collimator lens 63 is mounted on the second principal surface 30b of the carrier 30 with the third sub-base member 73 interposed therebetween.

The respective optical axes of the first to third collimator lenses 61 to 63 and the respective optical axes of the LDs 11 to 13 are adjusted to substantially coincide with each other. For example, each thickness of the first to third sub-mounts 21 to 23 is 0.15 mm, each height of laser light emitting points of the LDs 11 to 13 relative to the principal surfaces 21a to 23a of the sub-mounts 21 to 23 is 0.1 mm, and a height of the laser light emitting point relative to the first principal surface 30a as a reference is 0.25 mm.

Here, the first to third collimator lenses 61 to 63 may be, for example, lenses which are held by lens holders each of which have a square shape each side having a length of 1.0 mm in a side view, and a distance from one side of the lens holder to the center of the lens in the side view may be 0.5 mm. In this case, if a height of the level difference between the first principal surface 30a and the second principal surface 30b is set to about 0.25 mm, heights of the optical axes of the LDs 11 to 13 are substantially the same as heights of the optical axes of the collimator lenses 61 to 63.

The height of the level difference between the first principal surface 30a and the second principal surface 30b in the carrier 30 is preferably set to be higher by about several hundreds of μm than 0.25 mm, in consideration of the following: alignment values of the collimator lenses 61 to 63 in the up-down direction when the centers of the lenses are adjusted; and coating thicknesses of UV-curable resins for fixing the lens holders of the collimator lenses 61 to 63 onto the second principal surface 30*b*. Accordingly, for example, a thickness (thickness of the LD mount region of the carrier 30) of the carrier 30 itself is 1.0 mm, a thickness (thickness of the lens mount region of the carrier 30) of the second principal surface 30*b* in the carrier 30 is 0.4 mm, and the height of the level difference between the first principal surface 30*a* and the second principal surface 30*b* is 0.6 mm.

The first wavelength filter 81 is, for example, a multilayer film filter which is formed on a glass substrate, and is mounted on the second principal surface 30*b* of the carrier 30 with the fourth sub-base member 74 interposed therebetween. One surface of the first wavelength filter 81 is optically connected to the first collimator lens 61, and the other surface of the first wavelength filter 81 is optically connected to the second collimator lens 62. The first wavelength filter 81 transmits the red laser light LR which is collimated through the first collimator lens 61, and reflects the green laser light LG, which is collimated through the second collimator lens 62, in the front direction. The optical axis of the red laser light LR, which is transmitted through the first wavelength filter 81, and the optical axis of the green laser light LG, which is reflected by the first wavelength filter 81, are adjusted to substantially coincide with each other. As described above, the first wavelength filter 81 outputs combined light L1 in which the red laser light LR and the green laser light LG are combined.

In a manner similar to that of the first wavelength filter 81, the second wavelength filter 82 is, for example, a multilayer film filter which is formed on a glass substrate, and is mounted on the second principal surface 30*b* of the carrier 30 with the fifth sub-base member 75 interposed therebetween. One surface of the second wavelength filter 82 is optically connected to the other surface of the first wavelength filter 81, and the other surface of the second wavelength filter 82 is optically connected to the third collimator lens 63.

The second wavelength filter 82 transmits the red laser light LR and the green laser light LG (combined light L1) which are emitted from the first wavelength filter 81, and reflects the blue laser light LB, which is collimated through the third collimator lens 63, in the front direction. The optical axes of the red laser light LR and the green laser light LG, which are transmitted through the second wavelength filter 82, and the optical axis of the blue laser light LB, which is reflected by the second wavelength filter 82, are adjusted to substantially coincide with each other.

In addition, it is possible that a height of each center position of the first wavelength filter 81 and the second wavelength filter 82, in a case where the second principal surface 30*b* of the carrier 30 is set as a reference, is substantially the same as the height of the optical axis of each of the laser light LR, LG, and LB, in a case where the second principal surface 30*b* is set as a reference.

Each of the collimator lenses 61 to 63 and the wavelength filters 81 and 82 is fixed onto each of the sub-base members 71 to 75 by, for example, a paste of Ag or a solder. It is preferable that the material of the sub-base members 71 to 75 is a material, of which the thermal expansion coefficient is approximate to those of the collimator lenses 61 to 63 and the wavelength filters 81 and 82, for example, glass. Further, the sub-base members 71 to 75 may be formed of a ceramic or a metal. It is preferable that an area of a mounting surface (top surface) of each of the sub-base members 71 to 75 is of a size that can be coated with an amount of a UV-curable resin which is necessary to fix the collimator lenses 61 to 63 and the wavelength filters 81 and 82 mounted thereon, for example, 0.3 to 0.5 square millimeters.

The mirror 91 is mounted on the second principal surface 30*b* of the carrier 30 with a sixth sub-base member 76 interposed therebetween. The mirror 91 is disposed on the front side of the second wavelength filter 82. The mirror 91 reflects a part of the combined light L2 in the up direction, and transmits the remaining part in the front direction. The mirror 91 is formed in a right triangle shape having an inclined surface 91*a*, a bottom surface 91*b*, and a side surface 91*c* in a side view. That is, the mirror 91 has the bottom surface 91*b* and the inclined surface 91*a* that is inclined with respect to a direction in which the optical axis of the combined light L2 extends. The inclined surface 91*a* and the second principal surface 30*b* form an angle of substantially 45 degrees. The bottom surface 91*b* is fixed onto the carrier 30.

The inclined surface 91*a* of the mirror 91 reflects the combined light L2 in a direction intersecting with the second principal surface 30*b*. For example, a semi-transparent film is formed on the inclined surface 91*a*. Thus, a reflectance of light due to the inclined surface 91*a* is 95%, and a transmittance of the light due to the inclined surface 91*a* is 5%. The transmitted light, which transmits the inclined surface 91*a*, is refracted by the inclined surface 91*a* so as to be close to the second principal surface 30*b*.

The PD 92 is mounted on the second principal surface 30*b* of the carrier 30. The PD 92 is used for monitoring the laser light LR, LG, and LB. The PD 92 is electrically connected to the lead pins 51 through bonding wires B9. The PD 92 is disposed obliquely below the side surface 91*c* of the mirror 91. The PD 92 is able to detect an intensity of the combined light L2 by receiving the light which is refracted by the inclined surface 91*a* of the mirror 91.

It is preferable that the PD 92 has a high sensitivity for each of the red laser light LR, the green laser light LG, and the blue laser light LB. FIG. 3 is a graph illustrating a typical example of a sensitivity property in a case of using a PD made of Si as the PD 92. As shown in FIG. 3, compared with the red laser light LR (a wavelength of about 640 nm), the sensitivities of the green laser light LG (a wavelength of about 535 nm) and the blue laser light LB (a wavelength of about 440 nm) decrease, but the PD made of Si has a significant sensitivity. Therefore, the combined light L2, in which three colors are combined, can be monitored.

The thermistor 93 is disposed on the left side of the red LD 11 on the first principal surface 30*a* of the carrier 30. The thermistor 93 is electrically connected to the lead pins 51 through bonding wires B10.

In the three-color light source 1 configured as described above, the red laser light LR, the green laser light LG, and the blue laser light LB are respectively emitted from the red LD 11, the green LD 12, and the blue LD 13. These laser light LR, LG, and LB are collimated when respectively transmitting the first collimator lens 61, the second collimator lens 62, and the third collimator lens 63. Then, the red laser light LR and the green laser light LG are combined through the first wavelength filter 81, and thus the combined light L1 is output. The combined light L1 and the blue laser light LB are combined through the second wavelength filter 82, and thus the second combined light L2 is output. The combined light L2, which is formed of the red laser light LR, the green laser light LG, and the blue laser light LB, is reflected in a direction of the normal line to the second principal surface 30b of the carrier 30 by the inclined surface 91a of the mirror 91, and is emitted to the outside of the three-color light source 1.

Figure 4:
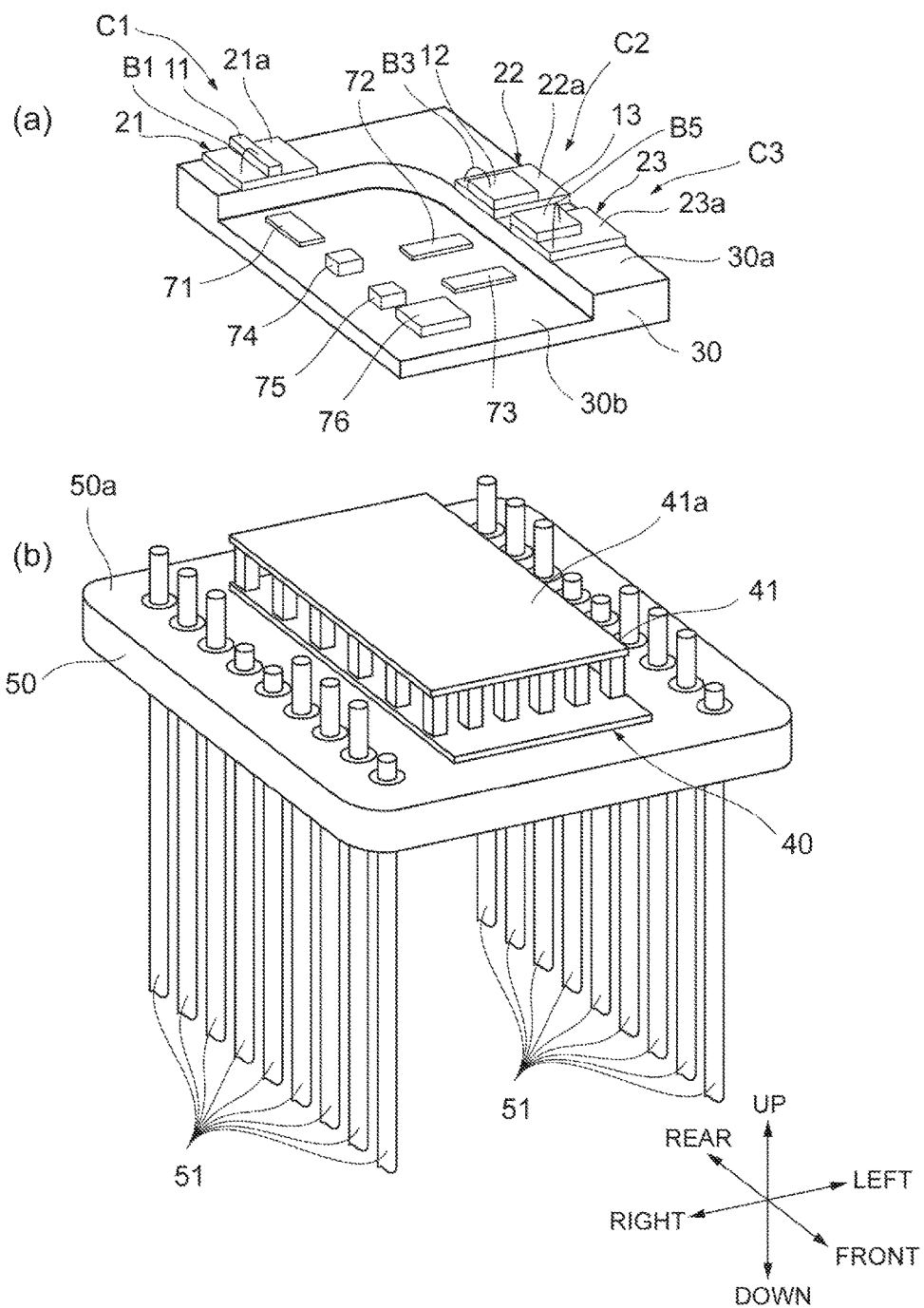
FIG. 4(a) is a perspective view illustrating a carrier and intermediate assembly.
FIG. 4(b) is a perspective view illustrating a TEC and a base member.

Next, a method of manufacturing the three-color light source 1 will be described. First, as shown in FIG. 4(a), the LDs 11 to 13 are respectively mounted on the principal surfaces 21a, 22a, and 23a of the sub-mounts 21 to 23. Then, electrical conduction is ensured by using wire bonding for patterns of the respective sub-mounts 21 to 23 from the upper electrodes of the respective LDs 11 to 13, and thereby intermediate assemblies C1, C2, and C3 formed of the LDs 11 to 13 and the sub-mounts 21 to 23 are generated. Subsequently, the intermediate assemblies C1 to C3 are respectively mounted on the first principal surface 30a of the carrier 30.

In addition, the sub-mounts 21 to 23 may be mounted on the first principal surface 30a of the carrier 30 first, thereafter the LDs 11 to 13 may be mounted on the respective principal surfaces 21a to 23a of the sub-mounts 21 to 23, and finally the sub-mounts 21 to 23 and the LDs 11 to 13 may be electrically connected through wire bonding. In this case, a process temperature at the time of mounting the sub-mounts 21 to 23 on the first principal surface 30a is higher than a process temperature at the time of mounting the LDs 11 to 13 on the principal surfaces 21a to 23a, and a process temperature at the time of mounting the LDs 11 to 13 on the principal surfaces 21a to 23a is higher than the process temperature of the wire bonding.

As described above, by making the process temperature at the time of mounting the sub-mounts 21 to 23 on the first principal surface 30a higher than the process temperature at the time of mounting the LDs 11 to 13 on the principal surfaces 21a to 23a, in a case where the LDs 11 to 13 are mounted, it is possible to avoid a situation where the positions of the sub-mounts 21 to 23 change. By making the process temperature at the time of mounting the LDs 11 to 13 on the principal surfaces 21a to 23a higher than the process temperature of the wire bonding, when the wire bonding is performed, it is possible to avoid a situation where the positions of the LDs 11 to 13 change.

While mounting the sub-mounts 21 to 23 and the LDs 11 to 13 on the above-mentioned carrier 30, the TEC 40 is mounted on the principal surface 50a of the base member 50. As shown in FIG. 4(b), the TEC 40 has an upper plate portion 41, and the top surface of the upper plate portion 41 is formed as a planar principal surface 41a. After the TEC 40 is mounted on the principal surface 50a, the carrier 30 is mounted on the principal surface 41a of the upper plate portion 41.

As shown in FIGS. 5 and 6, after the carrier 30 is mounted on the principal surface 41a of the TEC 40, the PD 92 is mounted on the second principal surface 30b of the carrier 30, and the thermistor 93 is mounted on the first principal surface 30a of the carrier 30. Then, wire bonding between the lead pins 51 and the wiring pad on the carrier 30, wire bonding between the lead pins 51 and the wiring pad of the TEC 40, and wire bonding between the lead pins 51 and the sub-mounts 21 to 23 are performed.

Here, a process temperature (the melting point of the eutectic solder) of a process of mounting the TEC 40 on the principal surface 50a of the base member 50 is higher than a process temperature of a process of mounting the carrier 30 on the principal surface 41a of the TEC 40. Further, the process temperature of the process of mounting the carrier 30 on the principal surface 41a is higher than the process temperature of the wire bonding.

As described above, by making the process temperature of the process of mounting the TEC 40 on the principal surface 50a higher than the process temperature of a process of mounting the carrier 30 on the principal surface 41a, in a case where the carrier 30 is mounted, it is possible to avoid a situation where the position of the TEC 40 changes. Further, by making the process temperature of the process of mounting the carrier 30 on the principal surface 41a higher than the process temperature of the wire bonding, when the wire bonding is performed, it is possible to avoid a situation where the position of the carrier 30 changes.

Next, a process of mounting the collimator lenses 61 to 63 will be described.

As shown in FIG. 7, at the time of mounting the collimator lenses 61 to 63, by adjusting the positions of the collimator lenses 61 to 63 while observing a pattern of projection of the light emitted from the collimator lenses 61 to 63, optical alignment of the collimator lenses 61 to 63 is performed.

At the time of adjusting the positions of the collimator lenses 61 to 63, it is detected whether or not the light emitted from each of the collimator lenses 61 to 63 is collimated. Here, if quality of the collimation is low (the collimation property is poor), aberrations (astigmatism and spherical aberration) of the combined light L2 of the red laser light LR, the green laser light LG, and the blue laser light LB increase, and a problem is likely to arise, for example, in that quality of the image deteriorates. Accordingly, in order to keep the collimation property high, in the present embodiment, optical alignment of the three collimator lenses 61 to 63 is performed in accordance with the following procedure.

First, relative positions of the red LD 11 and the first collimator lens 61 are determined. At this time, the first collimator lens 61 is mounted on the second principal surface 30b of the carrier 30 with the first sub-base member 71 interposed therebetween. Then, while the red LD 11 emits light, the first collimator lens 61 is fixed onto the first sub-base member 71. Here, the red laser light LR, which is emitted from the red LD 11, travels straight ahead without being reflected.

Further, the position of the first collimator lens 61 is adjusted in the up-down direction such that the optical axis of the red laser light LR is substantially parallel with the principal surfaces 30a and 30b of the carrier 30. At this time, for example, while the first sub-base member 71 is coated with the UV-curable resin and a thickness thereof is ensured, the position of the collet is adjusted in the up-down direction while the first collimator lens 61 is adhered by a collet or the like. Thereby, a tilt angle of the red laser light LR with respect to the principal surfaces 30a and 30b is adjusted.

Then, for example, an imaging element such as a CCD is disposed to be separated by a predetermined distance (for example, 1 to 2 m) in the front direction from the light emission end face of the red LD 11, by aligning the first collimator lens 61 while observing a beam diameter of the red laser light LR projected onto the CCD or the like, one focal point of the first collimator lens 61 coincides with the light emission end face of the red LD 11. In such a manner, by aligning one focal point of the first collimator lens 61 with the light emission end face of the red LD 11, the red laser light LR, which is output through the first collimator lens 61, becomes substantially collimated light.

In a case where a distance between the first collimator lens 61 and the light emission end face of the red LD 11 is shorter than a focal length of the first collimator lens 61, the red laser light LR, which is emitted from the first collimator lens 61, becomes divergent light. In contrast, in a case where the distance between the first collimator lens 61 and the light emission end face is longer than the focal length, the red laser light LR, which is emitted from the first collimator lens 61, becomes convergent light.

However, in the present embodiment, as described above, one focal point of the first collimator lens 61 coincides with the light emission end face of the red LD 11. Therefore, the light beams of the red laser light LR, which is emitted from the first collimator lens 61, are made to be substantially parallel, and thus the pattern of the projection thereof can be observed even at a position separated by several meters. As described above, after one focal point of the first collimator lens 61 is made to coincide with the light emission end face of the red LD 11, by curing the UV-curable resin on the first sub-base member 71, the first collimator lens 61 is fixed onto the first sub-base member 71.

Next, the relative positions of the green LD 12 and the second collimator lens 62 are determined. At this time, the second collimator lens 62 is mounted on the second principal surface 30b of the carrier 30 with the second sub-base member 72 interposed therebetween. Then, while the green LD 12 emits light, the second collimator lens 62 is fixed onto the second sub-base member 72. Here, the green laser light LG, which is emitted from the green LD 12, travels straight rightward without being reflected.

Further, the position of the second collimator lens 62 is adjusted in the up-down direction such that the optical axis of the green laser light LG is substantially parallel with the principal surfaces 30a and 30b of the carrier 30. At this time, for example, while the second sub-base member 72 is coated with the UV-curable resin and a thickness thereof is ensured, the positions of the collet is adjusted in the up-down direction while the second collimator lens 62 is adhered by a collet or the like. Thereby, a tilt angle of the green laser light LG with respect to the principal surfaces 30a and 30b is adjusted.

Then, for example, an imaging element such as a CCD is disposed to be separated by a predetermined distance (for example, 1 to 2 m) in the front direction from the light emission end face of the green LD 12, by aligning the second collimator lens 62 while observing a beam diameter of the green laser light LG projected onto the CCD or the like, one focal point of the second collimator lens 62 coincides with the light emission end face of the green LD 12. In such a manner, by aligning one focal point of the second collimator lens 62 with the light emission end face of the green LD 12, the green laser light LG, which is output through the second collimator lens 62, becomes substantially collimated light.

Instead of disposing the CCD or the like, an observation mirror, which reflects the green laser light LG in the front direction at a position separated by a predetermined distance from the light emission end face of the green LD 12 to the right side, may be disposed, and an imaging element such as a CCD may be disposed ahead of the observation mirror. Thereby, the above-mentioned alignment may be performed.

Subsequently, relative positions of the blue LD 13 and the third collimator lens 63 are determined. At this time, in a manner similar to that of the process of determining the relative positions of the green LD 12 and the second collimator lens 62, the light emission end face of the blue LD 13 is made to coincide with one focal point of the third collimator lens 63 so as to collimate the blue laser light LB, which is output through the third collimator lens 63. In addition, it is preferable that, in the above-mentioned processes, the optical axis of the red laser light LR, the optical axis of the green laser light LG, and the optical axis of the blue laser light LB have the same heights as each other.

Next, as shown in FIG. 8, the first wavelength filter 81 is mounted on the second principal surface 30b of the carrier 30. At this time, an angle of the first wavelength filter 81 is adjusted such that the pattern of projection of the green laser light LG on the imaging element such as the above-mentioned CCD is made to substantially coincide with the pattern of projection of the red laser light LR. Here, as shown in FIG. 9, the pattern of projection of the red laser light LR has an elliptical shape which is long in the X direction, and the pattern of projection of each of the green laser light LG and the blue laser light LB has a substantially circular shape. Accordingly, as described in the present embodiment, adjusting the pattern of projection of each of the green laser light LG and the blue laser light LB to the pattern of projection of the red laser light LR, which is used as a reference, makes it possible to easily perform position adjustment of each of the laser light LR, LG, and LB.

Specifically, first, the first wavelength filter 81 is disposed on the optical axis of the green laser light LG so as to reflect the green laser light LG and project a projection pattern on a projection surface of the CCD or the like. Then, by adjusting a deflection angle and a tilt angle of the first wavelength filter 81, the pattern of projection of the green laser light LG is made to substantially coincide with the pattern of projection of the red laser light LR. In such a manner, after the deflection angle and the tilt angle of the first wavelength filter 81 is adjusted and the pattern of projection of the green laser light LG is made to substantially coincide with the pattern of projection of the red laser light LR, the UV-curable resin on the fourth sub-base member 74 is cured, and the first wavelength filter 81 is fixed onto the fourth sub-base member 74.

The first wavelength filter 81 slightly shifts the pattern of projection of the red laser light LR sideways due to an effect of a thickness of the first wavelength filter 81. However, if the pattern of projection of each of the green laser light LG and the blue laser light LB is made to substantially coincide with the pattern of projection of the red laser light LR shifted sideways, it is possible to perform the alignment without any problem.

Subsequently, the second wavelength filter 82 is mounted on the second principal surface 30b of the carrier 30. At this time, in a manner similar to that when the first wavelength filter 81 is mounted, the deflection angle and the tilt angle of the second wavelength filter 82 are adjusted such that the pattern of projection of the blue laser light LB is made to substantially coincide with the pattern of projection of the red laser light LR. Further, the second wavelength filter 82 is disposed such that a light-reflecting surface of the first wavelength filter 81 and a light-reflecting surface of the second wavelength filter 82 are disposed to be parallel with each other. A specific adjustment method is the same as a procedure in which the above-mentioned first wavelength filter 81 is disposed.

Next, the mirror 91 is mounted on the second principal surface 30b of the carrier 30. The mirror 91 is mounted on the second principal surface 30b in a state where the inclined surface 91a and the second principal surface 30b form an angle of 45 degrees. The mirror 91 is fixed on the sixth sub-base member 76 by the UV-curable resin. Thereafter, hermetic sealing is performed in a state where the principal surface 50a of the base member 50 is covered by the cap 2 and an opening 2a of the cap 2 is positioned above the inclined surface 91a of the mirror 91, thereby forming the three-color light source 1.

As described above, in the three-color light source 1, the carrier 30 is equipped with the red LD 11, the green LD 12, the blue LD 13, the first collimator lens 61, the second collimator lens 62, the third collimator lens 63, the first wavelength filter 81, and the second wavelength filter 82. Further, the carrier 30 is mounted on the TEC 40. Accordingly, by controlling the temperature of the TEC 40 through an automatic temperature controller (ATC), temperatures of the red LD 11, the green LD 12, and the blue LD 13 are kept constant. As a result, the red LD 11, the green LD 12, and the blue LD 13 is unlikely to be affected by the ambient environmental temperature, and therefore light emitting characteristics thereof can be kept constant.

By keeping the temperatures constant through the TEC 40, it is possible to suppress variation of a state of optical coupling between the LDs 11 to 13 and the collimator lenses 61 to 63. Accordingly, it is possible to keep the collimation properties of the laser light LR, LG, and LB, which are emitted from the collimator lenses 61 to 63, high. As a result, in a case where the three-color mixed beams (combined light L2) are concentrated in the scanning optical system which is connected downstream (the output side of the combined light L2) of the three-color light source 1, it is possible to greatly reduce astigmatism and spherical aberration, and it is possible to reduce a possibility that color spreading occurs.

In the three-color light source 1, the mirror 91 reflects the laser light LR, LG, and LB (combined light L2) in a direction intersecting with the principal surfaces 30a and 30b of the carrier 30. Accordingly, it is possible to increase the opening 2a of the cap 2 without increasing the height of the cap 2. Therefore, it is possible to easily increase the beam diameter of the combined light L2.

In the three-color light source 1, the collimator lenses 61 to 63 are respectively disposed to correspond to the LDs 11 to 13 of three colors. Then, these collimator lenses 61 to 63 are mounted on the second principal surface 30b of the carrier 30 with three sub-base members 71 to 73 which are separated from each other. With such a configuration, a resin for fixing the collimator lenses 61 to 63 can be prevented from overflowing to fixed positions of the separate collimator lenses 61 to 63. Accordingly, by suppressing variation of the optical axis of the red laser light LR, the green laser light LG, and the blue laser light LB which are emitted from the LDs 11 to 13, it is possible to accurately perform optical axis adjustment.

Second Embodiment

Figure 10:
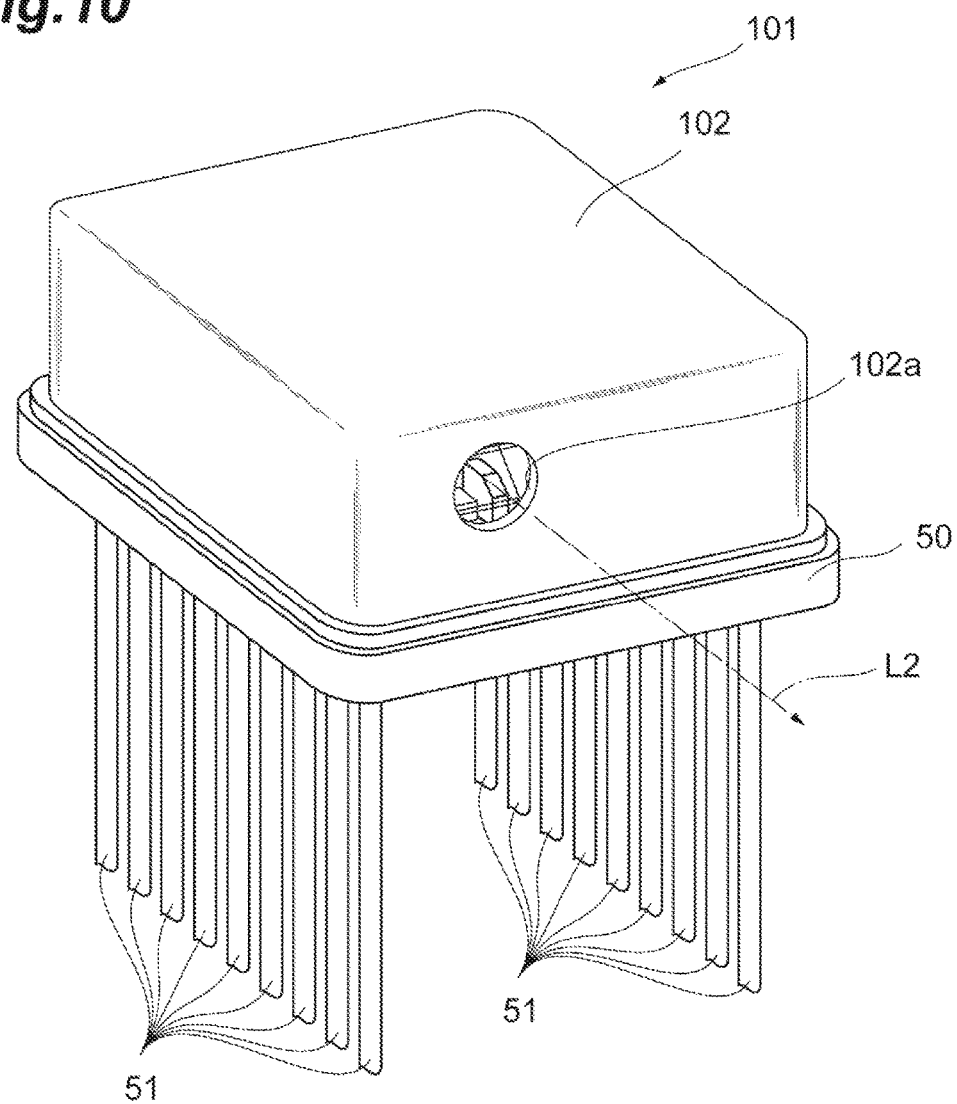
FIG. 10 is a perspective view illustrating a three-color light source according to a second embodiment of the present invention.

Next, a three-color light source 101 according to a second embodiment will be described. FIG. 10 is a perspective view illustrating an appearance of the three-color light source 101. FIG. 11 is a perspective view illustrating a state where a cap 102 is removed from the three-color light source 101. It should be noted that, in FIG. 11, for convenience of description, some components such as bonding wires B1 to B10 are omitted.

As shown in FIGS. 10 and 11, the three-color light source 101 is different from that of the first embodiment in that the direction of emission of the combined light L2 is a direction (front direction) which is substantially parallel with the principal surfaces 30a and 30b of the carrier 30. The three-color light source 101 includes the cap 102 having an opening 102a on the front side thereof. Further, the three-color light source 101 includes, instead of the mirror 91 and the PD 92 of the first embodiment, a beam splitter 191 and a PD 192. The beam splitter 191 is, for example, a semi-transparent mirror. It should be noted that a function of the PD 192 is the same as the function of the PD 92 of the first embodiment.

The beam splitter 191 is held in a state where it is inclined in contact with an inclined surface 131a of a pedestal 131 which is positioned on the front end of the carrier 30. The beam splitter 191 has an inclined surface 191a, and the inclined surface 191a and the second principal surface 30b of the carrier 30 form, for example, an angle of 45 degrees. The PD 192 is disposed below the inclined surface 191a.

For example, a dielectric multilayer film is attached to the inclined surface 191a of the beam splitter 191, and the inclined surface 191a has a function of reflecting a part of the combined light L2 in the down direction. That is, the beam splitter 191 reflects a part of the combined light L2, which is emitted from the second wavelength filter 82, in the down direction, and transmits the remaining part in the front direction. As described above, the inclined surface 191a is formed as a reflective surface that reflects the laser light LR, LG, and LB. The laser light LR, LG, and LB, which are reflected on the inclined surface 191a in the down direction, are incident onto the PD 192. The PD 192 is able to detect an intensity of the combined light L2 by receiving the light which is reflected on the inclined surface 191a of the beam splitter 191.

Also in the three-color light source 101 of the second embodiment configured in such a manner, the carrier 30 is mounted on the TEC 40. Therefore, it is possible to obtain an effect the same as that of the first embodiment.

The embodiments of the present invention have been hitherto described, but the present invention is not limited to the above-mentioned embodiments. Thus, the present invention may be modified without departing from the scope described in claims, or may be applied as another embodiment. Consequently, the present invention can be modified into various forms without departing from the scope of the present invention.

For example, in the embodiments, the first wavelength filter 81, which transmits the red laser light LR collimated through the first collimator lens 61 and reflects the green laser light LG collimated through the second collimator lens 62 in the front direction, is used. However, instead of the first wavelength filter 81, a wavelength filter, which reflects the red laser light LR and transmits the green laser light LG, may be used. Further, instead of the second wavelength filter 82 that transmits the combined light L1 and reflects the blue laser light LB, a wavelength filter, which reflects the combined light L1 and transmits the blue laser light LB, may be used.

REFERENCE SIGNS LIST 1, 101: three-color light source, 2, 102: cap, 2a, 102a: opening, 11: red LD (first laser diode), 12: green LD (second laser diode), 13: blue LD (third laser diode), 30: carrier, 30a: first principal surface (principal surface), 30b: second principal surface (principal surface), 40: TEC (temperature control element), 61: first collimator lens, 62: second collimator lens, 63: third collimator lens, 71: first sub-base member, 72: second sub-base member, 73: third sub-base member, 74: fourth sub-base member, 75: fifth sub-base member, 76: sixth sub-base member, 81: first wavelength filter, 82: second wavelength filter, 91: mirror, 91a: inclined surface, 91b: bottom, 91c: side, 92, 192: PD (photo diode), 191: beam splitter, L1: first combined light, L2: second combined light, LR: red laser light (first laser light), LG: green laser light (second laser light), LB: blue laser light (third laser light)

The invention claimed is:

1. A three-color light source that outputs light by combining red, green and blue laser light, the three-color light source comprising:
    a first laser diode that is formed of a GaAs-based material and emits first laser light;
    a second laser diode that is formed of a GaN-based material and emits second laser light;
    a third laser diode that is formed of a GaN-based material and emits third laser light with a wavelength which is different from that of the second laser light;
    a first collimator lens that collimates the first laser light;
    a second collimator lens that collimates the second laser light;
    a third collimator lens that collimates the third laser light;
    a first wavelength filter that transmits the first laser light which is collimated through the first collimator lens, reflects the second laser light which is collimated through the second collimator lens, and outputs first combined light in which the first laser light and the second laser light are combined;
    a second wavelength filter that performs a one of transmission and reflection on the first combined light, performs an other of transmission and reflection on the third laser light which is collimated through the third collimator lens, and outputs second combined light in which the first combined light and the third laser light are combined;
    a carrier that is equipped with the first to third laser diodes, the first to third collimator lenses, and the first and second wavelength filters,
    wherein the first laser diode is equipped on the carrier via a first sub-mount,
    wherein the second laser diode is equipped on the carrier via a second sub-mount,
    wherein the third laser diode is equipped on the carrier via a third sub-mount, and
    wherein surfaces of the first to third sub-mounts whereon the first to third laser diodes are equipped are substantially orthogonal to a thickness direction of the carrier.

2. The three-color light source according to claim 1, wherein the first laser light is red, one of the second and third laser light is green, and the other of the second and third laser light is blue.

3. The three-color light source according to claim 1, further comprising:
    a mirror that reflects a part of the second combined light and transmits a remaining part thereof; and
    a photo diode that detects an intensity of the second combined light which is transmitted through the mirror.

4. The three-color light source according to claim 3, wherein the mirror reflects the second combined light in a direction intersecting with a principal surface of the carrier.

5. The three-color light source according to claim 3,
    wherein the mirror has a bottom and an inclined surface which is inclined with respect to a direction in which an optical axis of the second combined light extends,
    wherein the bottom is fixed onto the carrier, and
    wherein the photo diode detects an intensity of the second combined light which is refracted at the inclined surface of the mirror.

6. The three-color light source according to claim 2, further comprising:
    a mirror that reflects a part of the second combined light and transmits a remaining part thereof; and
    a photo diode that detects an intensity of the second combined light which is transmitted through the mirror.

7. The three-color light source according to claim 6, wherein the mirror reflects the second combined light in a direction intersecting with a principal surface of the carrier.

8. The three-color light source according to claim 4,
    wherein the mirror has a bottom and an inclined surface which is inclined with respect to a direction in which an optical axis of the second combined light extends,
    wherein the bottom is fixed onto the carrier, and
    wherein the photo diode detects an intensity of the second combined light which is refracted at the inclined surface of the mirror.

9. The three-color light source according to claim 7,
    wherein the mirror has a bottom and an inclined surface which is inclined with respect to a direction in which an optical axis of the second combined light extends,
    wherein the bottom is fixed onto the carrier, and
    wherein the photo diode detects an intensity of the second combined light which is refracted at the inclined surface of the mirror.

10. A three-color light source that outputs light by combining red, green and blue laser light, the three-color light source comprising:
    a first laser diode that is formed of a GaAs-based material and emits first laser light;
    a second laser diode that is formed of a GaN-based material and emits second laser light;
    a third laser diode that is formed of a GaN-based material and emits third laser light with a wavelength which is different from that of the second laser light;
    a first collimator lens that collimates the first laser light;
    a second collimator lens that collimates the second laser light;
    a third collimator lens that collimates the third laser light;
    a first wavelength filter that transmits the first laser light which is collimated through the first collimator lens, reflects the second laser light which is collimated through the second collimator lens, and outputs first combined light in which the first laser light and the second laser light are combined;
    a second wavelength filter that performs a first operation on the first combined light, wherein the first operation is selected from a group of operations comprising transmission and reflection, performs a second operation selected from the group of operations on the third laser light which is collimated through the third collimator lens, wherein the second operation is different from the first operation, and outputs second combined light in which the first combined light and the third laser light are combined; and
    a carrier that is equipped with the first to third laser diodes, the first to third collimator lenses, and the first and second wavelength filters,
    wherein the first laser diode is equipped on the carrier via a first sub-mount,
    wherein the second laser diode is equipped on the carrier via a second sub-mount,
    wherein the third laser diode is equipped on the carrier via a third sub-mount, and
    wherein surfaces of the first to third sub-mounts whereon the first to third laser diodes are equipped are substantially orthogonal to a thickness direction of the carrier.

11. A three-color light source that outputs light by combining red, green and blue laser light, the three-color light source comprising:
    a first laser diode that emits first laser light;
    a second laser diode that emits second laser light;

a third laser diode that emits third laser light with a wavelength which is different from that of the second laser light;

a first collimator lens that collimates the first laser light;

a second collimator lens that collimates the second laser light;

a third collimator lens that collimates the third laser light;

a first wavelength filter that transmits the first laser light which is collimated through the first collimator lens, reflects the second laser light which is collimated through the second collimator lens, and outputs first combined light in which the first laser light and the second laser light are combined;

a second wavelength filter that performs a first operation on the first combined light, wherein the first operation is selected from a group of operations comprising transmission and reflection, performs a second operation selected from the group of operations on the third laser light which is collimated through the third collimator lens, wherein the second operation is different from the first operation, and outputs second combined light in which the first combined light and the third laser light are combined; and a carrier that is equipped with the first to third laser diodes, the first to third collimator lenses, and the first and second wavelength filters, wherein the first laser diode is equipped on the carrier via a first sub-mount, wherein the second laser diode is equipped on the carrier via a second sub-mount, wherein the third laser diode is equipped on the carrier via a third sub-mount, and wherein surfaces of the first to third sub-mounts whereon the first to third laser diodes are equipped are substantially orthogonal to a thickness direction of the carrier.

12. The three-color light source according to claim 1, wherein the carrier has a first principal surface, and a second principal surface parallel to and lower than the first principal surface, wherein the first to third laser diodes are equipped on the first principal surface, and wherein the first to third collimator lenses, and the first and second wavelength filters are equipped on the second principal surface.

13. The three-color light source according to claim 10, wherein the carrier has a first principal surface, and a second principal surface parallel to and lower than the first principal surface, wherein the first to third laser diodes are equipped on the first principal surface, and wherein the first to third collimator lenses, and the first and second wavelength filters are equipped on the second principal surface.

14. The three-color light source according to claim 11, wherein the carrier has a first principal surface, and a second principal surface parallel to and lower than the first principal surface, wherein the first to third laser diodes are equipped on the first principal surface, and wherein the first to third collimator lenses, and the first and second wavelength filters are equipped on the second principal surface.

* * * * *